United States Patent
Kwon et al.

(10) Patent No.: US 7,893,440 B2
(45) Date of Patent: Feb. 22, 2011

(54) THIN FILM TRANSISTOR ARRAY ARRANGEMENT, AND ORGANIC LIGHT EMITTING DISPLAY DEVICE

(75) Inventors: Do-Hyun Kwon, Suwon-si (KR); Choong-Youl Im, Suwon-si (KR); Dae-Hyun No, Suwon-si (KR); Il-Jeong Lee, Suwon-si (KR); Cheol-Ho Yu, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 12/385,792

(22) Filed: Apr. 20, 2009

(65) Prior Publication Data

US 2009/0278131 A1    Nov. 12, 2009

(30) Foreign Application Priority Data

May 6, 2008    (KR) ...................... 10-2008-0041867

(51) Int. Cl.
*H01L 29/04*    (2006.01)
*H01L 29/47*    (2006.01)

(52) U.S. Cl. .......................................... 257/72; 257/40

(58) Field of Classification Search .................. 257/40, 257/72, E51.018
See application file for complete search history.

(56) References Cited

U.S. PATENT DOCUMENTS

| 2005/0040753 | A1* | 2/2005 | Osame et al. | 313/500 |
|---|---|---|---|---|
| 2005/0179829 | A1* | 8/2005 | Park et al. | 349/44 |
| 2006/0079035 | A1 | 4/2006 | Eguchi et al. | |
| 2006/0255726 | A1* | 11/2006 | Kim | 313/506 |
| 2007/0128551 | A1 | 6/2007 | Lee | |
| 2007/0238227 | A1* | 10/2007 | Jun et al. | 438/149 |

(Continued)

FOREIGN PATENT DOCUMENTS

KR    1020040089221 A    10/2004

(Continued)

OTHER PUBLICATIONS

Search Report from European Patent Office issued in Applicant's corresponding European Patent Application No. 09159514.0 dated Nov. 16, 2009.

(Continued)

*Primary Examiner*—Phuc T Dang
(74) *Attorney, Agent, or Firm*—Robert E. Bushnell, Esq.

(57) ABSTRACT

A thin film transistor (TFT) array arrangement, an organic light emitting display device that includes the TFT array arrangement and a method of making the TFT array arrangement and the organic light emitting display device. The method seeks to reduce the number of masks used in the making of the TFT array arrangement by employing half-tone masks that are followed by a two step etching process and by forming layers of the capacitor simultaneous with the formation of layers of the source, drain and pixel electrodes. As a result, individual layers of the capacitor are on the same level and are made of the same material as ones of the layers of the source, drain and pixel electrodes. The capacitor has three electrodes spaced apart by two separate dielectric layers to result in an increased capacity capacitor without increasing the size of the capacitor.

29 Claims, 9 Drawing Sheets

U.S. PATENT DOCUMENTS

| | | |
|---|---|---|
| 2007/0254415 A1 | 11/2007 | Oh et al. |
| 2008/0055503 A1 | 3/2008 | Cheng |
| 2008/0246027 A1* | 10/2008 | Kim .......................... 257/40 |
| 2008/0246050 A1* | 10/2008 | Lee et al. .................... 257/99 |

FOREIGN PATENT DOCUMENTS

| KR | 1020060066512 A | 6/2006 |
|---|---|---|
| KR | 1002006014219 A | 10/2006 |

OTHER PUBLICATIONS

The Registration Determination Certificate issued on May 28, 2010 by the Korean Intellectual Property Office for a Korean application corresponding to 10-2008-0041867.

* cited by examiner

THIN FILM TRANSISTOR ARRAY ARRANGEMENT, AND ORGANIC LIGHT EMITTING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 6 May 2008 and there duly assigned Serial No. 10-2008-0041867.

BACKGROUND OF THE INVENTION

1. Field of the Invention

The present invention relates to a thin film transistor (TFT) array arrangement having a simplified manufacturing process, an organic light emitting display device having the same, and a method of manufacturing a TFT array arrangement for a flat panel display.

2. Description of the Related Art

TFT array arrangements, including electronic components, such as thin film transistors, capacitors and wires connecting the electronic components, are widely used for flat panel display devices such as liquid crystal display devices and organic light emitting display devices. In general, to form a fine pattern including a TFT array arrangement, the fine pattern is transferred to a substrate using a mask on which the fine pattern is drawn.

A photolithography process is generally used to transfer a pattern using a mask. According to the photolithography process, photoresist is uniformly coated on a substrate where a pattern is to be formed. After the pattern on a mask is exposed by using exposure equipment such as a stepper, the exposed photoresist is developed. After the photoresist is developed, a series of processes such as etching the pattern using remaining photoresist as a mask and then removing unnecessary photoresist are performed.

In the process of transferring a pattern using a mask, since a mask having a necessary pattern is needed, as the number of processes using masks increases, manufacturing costs increase due to the preparation of the masks. Also, since the above-mentioned complicated processes are needed, the overall manufacturing process is complicated and manufacturing time increases, thereby increasing manufacturing costs.

SUMMARY OF THE INVENTION

The present invention provides a TFT array arrangement, an organic light emitting flat panel display device and a method of making the same that can be produced using fewer photolithography masks, resulting in a simplified and less expensive manufacturing process and an improved design.

According to an aspect of the present invention, there is provided a TFT array arrangement that includes a substrate, an active layer of a TFT and a first electrode of a capacitor arranged on the substrate in a pattern, the active layer and the first electrode being comprised of a same material and being separated from each other by a distance, the active layer including a source region, a drain region and a channel region, a first insulation layer separately arranged on the active layer and on the first electrode, a gate electrode and a second electrode arranged on the first insulation layer, the gate electrode and the second electrode being arranged on a same layer and being comprised of a same material, the gate electrode being arranged to correspond to the channel region of the active layer and the second electrode being arranged to correspond to the first electrode, a second insulation layer arranged on the substrate, the first insulation layer, the gate electrode, and the second electrode, the second insulation layer being perforated by contact holes exposing the source region and the drain region of the active layer, a source electrode and a drain electrode arranged within the contact holes and providing electrical connection to the source region and the drain region respectively of the active layer, a pixel electrode arranged on the second insulation layer and being connected to one of the source electrode and the drain electrode and a third electrode being arranged on the second insulation layer at a location that corresponds to the second electrode, the third electrode being comprised of same materials as that of the combination of the source electrode, the drain electrode and the pixel electrode.

The TFT array arrangement can also include a pixel defining layer arranged on the second insulation layer, an edge portion of the pixel electrode, the source and drain electrodes, and the third electrode. The active layer of the TFT and the first electrode of the capacitor can include a multi-crystal silicon produced by crystallizing amorphous silicon. Shapes of end portions of the active layer and the first insulation layer of the TFT can be the same. Shapes of end portions of each of the first electrode, the first insulation layer, and the second electrode of the capacitor can all be the same. The TFT array arrangement can also include a buffer layer arranged on the substrate. A thickness of the second insulation layer can be greater than that of the first insulation layer. A top surface of the second insulation layer can be substantially flat. The pixel electrode can include a light transmitting material. The pixel electrode can include at least one material selected from a group consisting of indium tin oxide (ITO), indium zinc oxide (IZO), ZnO, and $In_2O_3$.

The pixel electrode can include a reflective material layer arranged on the second insulation layer and a light transmitting material layer arranged on the reflective material layer. The reflective material layer of the pixel electrode can include at least one material selected from a group consisting of Al, AlNd, ACX, AlNiLa, Ag, Mo, Ti, and MoW. The light transmitting material layer of the pixel electrode can include at least one material selected from a group consisting of indium 11 tin oxide (ITO), indium zinc oxide (IZO), ZnO, and $In_2O_3$. The third electrode of the capacitor can include a first layer comprised of a same material as the reflective material layer of the pixel electrode, a second layer comprised of a same material as the light transmitting material layer of the pixel electrode and a third layer comprised of a same material as a top layer of the source electrode and the drain electrode. The shapes of end portions of each of the first, second, and third layers of the third electrode of the capacitor can all be the same.

According to another aspect of the present invention, there is provided an organic light emitting display device that includes an interlayer arrangement including an organic light emitting layer arranged on the pixel electrode of the TFT array arrangement as described above and a common electrode arranged on the interlayer arrangement. The display device can also include a pixel defining layer arranged on the second insulation layer, an edge of the pixel electrode, the source and drain electrodes, and on the third electrode. The display device can also include a sealing structure to seal the organic light emitting layer, the sealing structure being arranged on the common electrode. The display device can be a bottom emission display device where light produced within the organic light emitting layer is transmitted through the substrate to be viewed. The pixel electrode can include a reflective material layer arranged on the second insulation layer and a light transmitting material layer arranged on the reflective material layer. The display device can be a top emission display device where light produced within the organic light emitting layer proceeds away from the substrate to be viewed.

According to still another aspect of the present invention, there is provided a method of manufacturing the TFT array arrangement, including forming a semiconductor layer on a substrate, depositing a first insulation layer and a first conductive layer on the semiconductor layer, forming an active layer, a gate insulation layer, and a gate electrode of a TFT and a first electrode, a first dielectric layer, and a second electrode of a capacitor by simultaneously patterning the semiconductor layer, the first insulation layer, and the first conductive layer via a first mask process, depositing a second insulation layer on the substrate, exposing a part of a source and a drain region of the active layer of the TFT by forming a contact holes in the second insulating layer via a second mask process, forming electrical contact with the source and drain regions of the active layer by sequentially depositing a second conductive layer and a third conductive layer onto the second insulation layer and into the contact holes, forming a source electrode, a drain electrode, a pixel electrode of the TFT and a third electrode of the capacitor by simultaneously patterning the second conductive layer and the third conductive layer via a third mask process, depositing a third insulation layer on the source electrode, the drain electrode, the pixel electrode, the third electrode and on exposed portions of the second insulation layer and exposing the pixel electrode by patterning the third insulation layer via a fourth mask process.

The forming of the semiconductor layer can include depositing an amorphous silicon layer on the substrate and producing multi-crystal silicon by crystallizing the amorphous silicon layer. The first mask process can use a first half-tone mask that includes a semi-light transmitting portion at a location that corresponds to the gate electrode. The gate insulation layer of the TFT and the first dielectric layer of the capacitor can be completely separated from each other upon said patterning. The produced display device can also have a buffer layer between the substrate and the semiconductor layer. The method can also include doping impurities into the source region and the drain region of the active layer using a gate electrode as a doping mask. The third mask process can use a second half-tone mask that includes a semi-light transmitting portion at a location that corresponds to the gate electrode. A fourth conductive layer can also be arranged between the second conductive layer and the second insulation layer perforated by the contact holes, and each of the source electrode, the drain electrode and the third electrode can include portions of each of the fourth conductive layer, the second conductive layer and the third conductive layer, and the pixel electrode can include portions of the fourth conductive layer and the second conductive layer. The fourth conductive layer can include at least one material selected from a group consisting of Al, AlNd, ACX, AlNiLa, Ag, Mo, Ti, and MoW.

According to yet another aspect of the present invention, there is provided a method of manufacturing an organic light emitting display device that includes forming an interlayer arrangement that includes an organic light emitting layer on a TFT array arrangement manufactured as previously described and forming a common electrode on the interlayer arrangement.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicated the same or similar components, wherein.

DETAILED DESCRIPTION OF THE EMBODIMENTS

Figure 1:
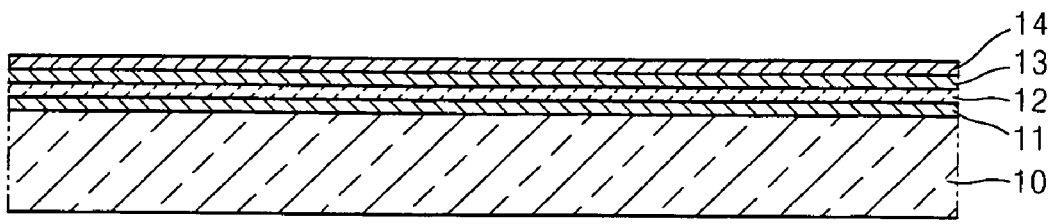
FIGS. 1-11 are cross-sectional views showing a method of manufacturing a TFT array arrangement and a TFT array arrangement according to an embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the principles for the present invention.

Recognizing that sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. Like reference numerals designate like elements throughout the specification. It will be understood that when an element such as a layer, film, region, or substrate is referred to as being on another element, it can be directly on the other element or intervening elements may also be present. Alternatively, when an element is referred to as being directly on another element, there are no intervening elements present.

In order to clarify the present invention, elements extrinsic to the description are omitted from the details of this description, and like reference numerals refer to like elements throughout the specification.

In several exemplary embodiments, constituent elements having the same configuration are representatively described in a first exemplary embodiment by using the same reference numeral and only constituent elements other than the constituent elements described in the first exemplary embodiment will be described in other embodiments.

Figure 9:
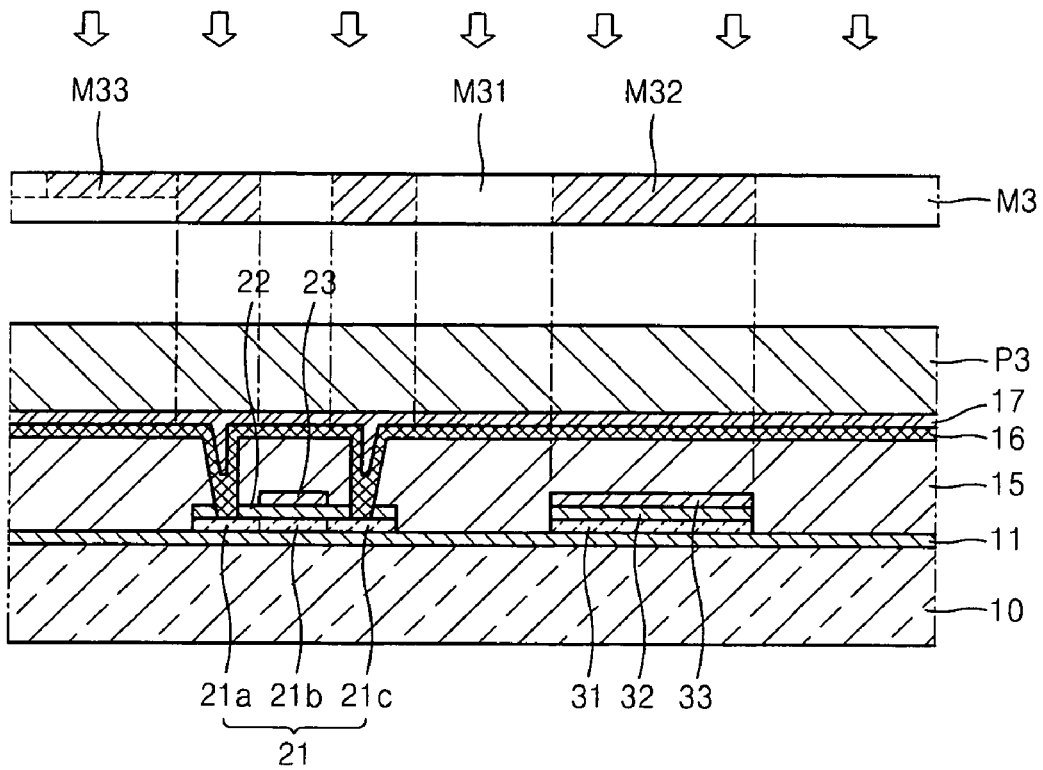
Figure 10:
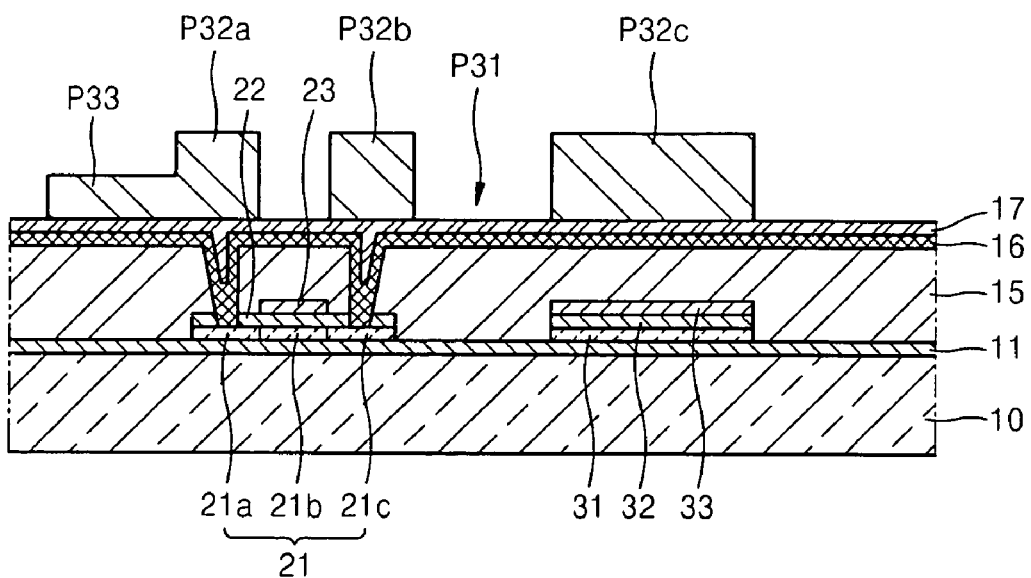
Figure 11:
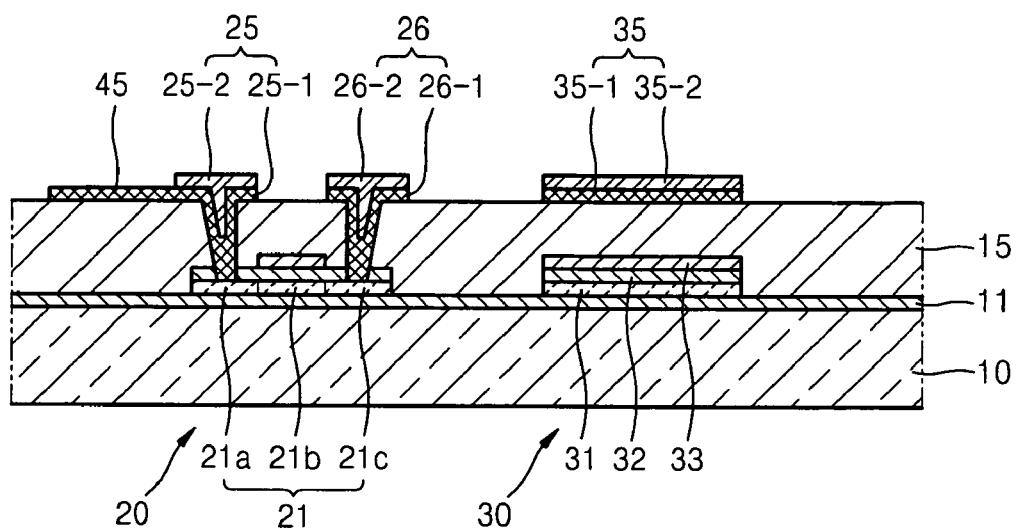

Turning now to FIGS. 1-11, FIGS. 1-10 are cross-section views sequentially showing a method of manufacturing a TFT array arrangement according to an embodiment of the present invention and FIG. 11 is a cross-sectional view schematically showing a TFT array arrangement according to an embodiment of the present invention. Referring to FIGS.

1-11, the TFT array arrangement according to the present embodiment includes a substrate 10, a buffer layer 11, a second insulation layer 15, a TFT 20, a capacitor 30, and a pixel electrode 45.

The substrate 10 can be made out of a transparent glass material having $SiO_2$ as a main ingredient. The substrate 10 can instead be made out of opaque materials or other materials such as a plastic member. However, for a bottom emission organic light emitting display device where an image is embodied at the side of the substrate 10, the substrate 10 must be made out of a transparent material.

The buffer layer 11 can be provided on the upper surface of the substrate 10 to facilitate the levelness of the substrate 10 and to prevent intrusion of impurities. The buffer layer 11 can be deposited by a variety of deposition techniques, using $In_2O_3$ and/or $SiN_x$, such as a plasma enhanced chemical vapor deposition (PECVD) technique, an atmospheric pressure CVD (APCVD) technique, and a low pressure CVD (LPCVD) technique.

Referring now to FIG. 1, a semiconductor layer 12, a first insulation layer 13, and a first conductive layer 14 are sequentially formed on and above the buffer layer 11. The semiconductor layer 12 is produced by depositing amorphous silicon and crystallizing the deposited amorphous silicon into multi-crystal silicon. The amorphous silicon can be crystallized by a variety of techniques such as a rapid thermal annealing (RTA) technique, an excimer laser annealing (ELA) technique, a metal induced crystallization (MIC) technique, a metal induced lateral crystallization (MILC) technique or a sequential lateral solidification (SLS) technique. The semiconductor layer 12 made out of amorphous silicon as above is patterned into an active layer 21 for the TFT 20 and a first electrode 31 for the capacitor 30 which will be described later (please refer to FIG. 11).

The first insulation layer 13 is deposited on the semiconductor layer 12. The first insulation layer 13 can be produced by depositing an inorganic insulation layer such as $SiN_x$ or $SiO_x$ using any of the PECVD technique, the APCVD technique or the LPCVD technique. The first insulation layer 13 is interposed between the active layer 21 and a gate electrode 23 of the TFT 20 and functions as a gate insulation layer 22 of the TFT 20. Also, the first insulation layer 13 is interposed between the first electrode 31 and a second electrode 33 and functions as a first dielectric layer 32 of the capacitor 30.

The first conductive layer 14 is deposited on the first insulation layer 13. The first conductive layer 14 can be produced by depositing one or more conductive materials selected from a group consisting of Ag, Mg, Al, Pt, Pd, Au, Ni, Nd, Ir, Cr, Li, Ca, Mo, Ti, W, MoW, and Al/Cu by a variety of deposition methods. The first conductive layer 14 functions as the gate electrode 23 of the TFT 20 and as the second electrode 33 of the capacitor 30.

Figure 2:
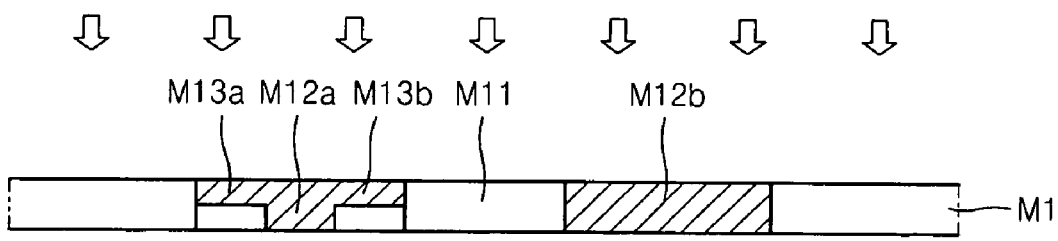
Figure 2:
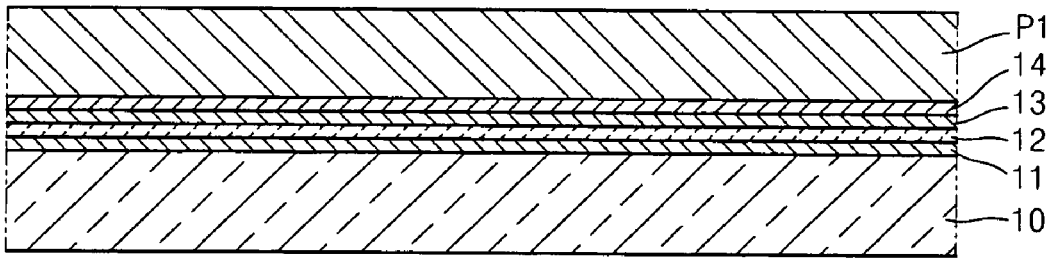

Referring now to FIG. 2, photoresist is coated on the upper surface of the structure of FIG. 1. Then, a first photoresist layer P1 is formed by removing a solvent by pre-baking or soft baking the photoresist. A first mask M1 on which a predetermined pattern is drawn is prepared and aligned to the substrate 10 to pattern the first photoresist layer P1.

The first mask M1 is a half-tone mask including a light transmitting portion M11, light shielding portions M12a and M12b, and semi-light transmitting portions M13a and M13b. The light transmitting portion M11 transmits light of a predetermine wavelength, the light shielding portions M12a and M12b block the incident light, and the semi-light transmitting portions M13a and M13b transmit a portion of the incident light.

The first mask M1 shown in FIG. 2 is conceptual in order to explain the function of the parts of the mask. Actually, the first mask M1 can be formed in a predetermined pattern on a transparent substrate such as quartz Qz. In this case, the light shielding portions M12a and M12b are formed by patterning the quartz substrate using a material such as Cr or $CrO_2$. The semi-light transmitting portions M13a and M13b are capable of controlling light transmissivity of the incident light by adjusting the ratio or thickness of composition components using at least one material of Cr, Is, Mo, Ta, and Al.

Figure 3:
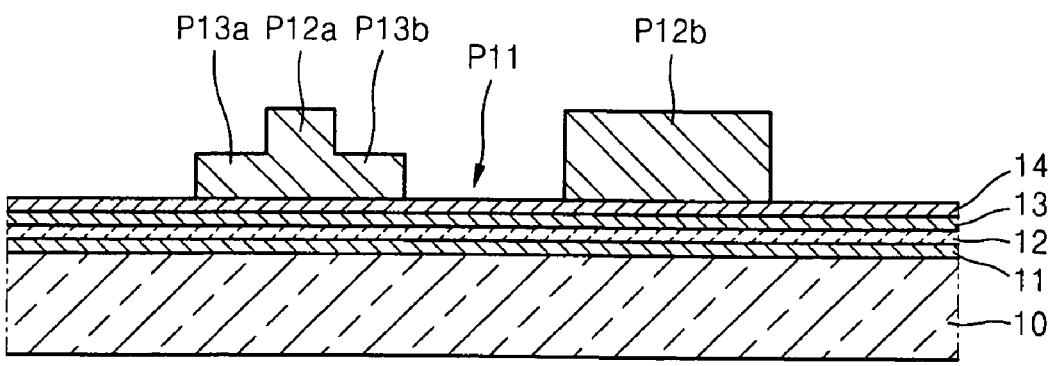

Exposure is performed by aligning the first mask M1 that is patterned as above to the TFT array arrangement 10 and radiating light of a predetermined wavelength on the first photoresist layer, P1. Referring to FIG. 3, a pattern of the first photoresist layer P1 remains after the exposed portion 11 of the first photoresist layer P1 is removed. Although in the present embodiment a positive photoresist (positive-PR) where an exposed portion is removed is used, the present invention is not limited thereto and a negative photoresist (negative-PR) can instead be used.

In FIG. 3, a photoresist portion P11 of the first photoresist layer P1 corresponding to the light transmitting portion M11 of the first mask M1 is removed. Photoresist portions P12a and P12b of the first photoresist layer P1 corresponding to the light shielding portions M12a and M12b and photoresist portions P13a and P13b of the first photoresist layer P1 corresponding to the semi-light transmitting portions M13a and M13b are still present. The thicknesses of the photoresist portions P13a and P13b corresponding to the semi-light transmitting portions M13a and M13b are thinner than those of the photoresist portions P12a and P12b corresponding to the light shielding portions M12a and M12b. The thicknesses of the photoresist portions P13a and P13b can be adjusted by changing the composition ratio or thickness of a material forming the pattern of the semi-light transmitting portions M13a and M13b of mask M1.

The semiconductor layer 12, the first insulation layer 13, and the first conductive layer 14 above the substrate 10 are etched using an etching equipment by using the photoresist portions P12a, P12b, P13a, and P13b as etch masks. The etching process can be performed by a variety of techniques such as wet etching and dry etching.

Figure 4:
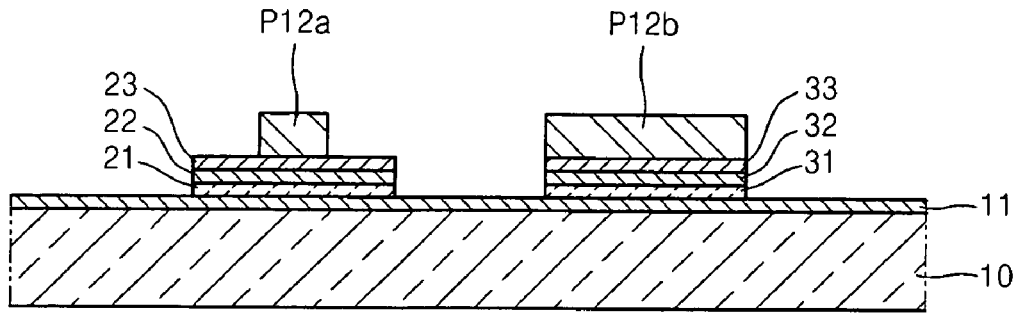

Referring now to FIG. 4, during the first etching process, the semiconductor layer 12, the first insulation layer 13, and the first conductive layer 14 of the portion P11 where no photoresist layer exists are etched away. Although the photoresist portions P13a and P13b corresponding to the semi-light transmitting portions M13a and M13b of FIG. 3 are etched away, a lower structure remains intact. The lower structure of semiconductive layer 12, first insulation layer 13 and first conductive layer 14, when patterned, becomes the active layer 21, the gate insulation layer 22, and the gate electrode 23 respectively of the TFT 20, and the first electrode 31, the dielectric layer 32, and the second electrode 33 respectively of the capacitor 30. Parts of the photoresist portions P12a and P12b corresponding to the light shielding portions M12a and M12b are still present after the first etching and will be used as etch masks during a second etching.

Figure 5:
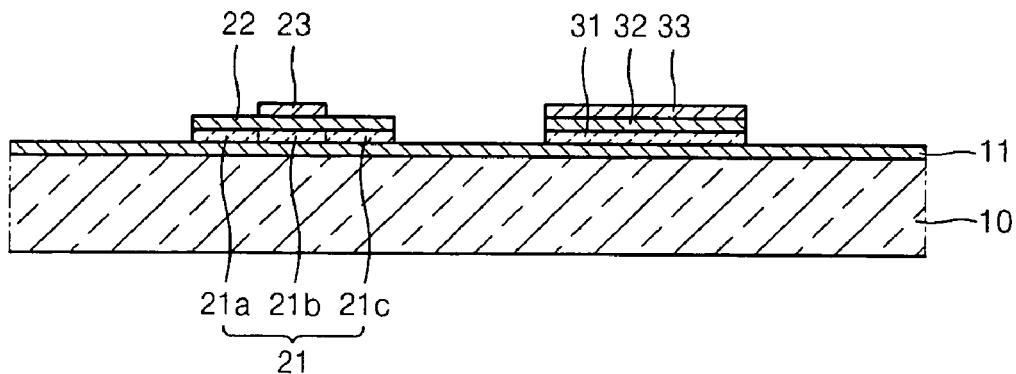

Referring now to FIG. 5, after the second etching process, the photoresist portions P12a and P12b of FIG. 4 are entirely etched away. In particular, a part of a first conductive layer 14 under the photoresist portion P12a is not etched so that the gate electrode 23 can be formed to corresponding to the middle portion of the active layer 21.

In FIG. 5, since the active layer 21, the gate insulation layer 22, and the gate electrode 23 of the TFT 20, and the first electrode 31, the dielectric layer 32, and the second electrode 33 of the capacitor 30 are simultaneously patterned on the same structure using the same mask M1, the active layer 21 of the TFT 20 and the first electrode 31 of the capacitor 30 are formed on a same layer and made out of a same material, and the gate electrode 23 of the TFT 20 and the second electrode 33 of the capacitor 30 are also formed from the same layer and made out of the same material.

Also, since the active layer 21, the gate insulation layer 22, and the gate electrode 23 of the TFT 20, and the first electrode 31, the dielectric layer 32, and the second electrode 33 of the capacitor 30 are simultaneously patterned using the same mask M1, the shapes of end portions formed by the active layer 21 and the gate insulation layer 22 of the TFT 20 are identical and the shapes of end portions formed by the first electrode 31, the first dielectric layer 32, and the second electrode 33 of the capacitor 30 are identical.

Since the first photoresist layer P1 between the TFT 20 and the capacitor 30 is directly exposed through the light transmitting portion M11 of the first mask M1 so as to be completely removed upon developing and prior to etching, the structures between the TFT 20 and the capacitor 30 are all removed at the same time during the first etching process. Thus, since the first insulation layer 13 is completely removed from the space between TFT 20 and the capacitor 30, the gate insulation layer 22 of the TFT 20 and the first dielectric layer 32 of the capacitor 30 are completely separated from each other upon patterning. Also, although it is not illustrated in detail in FIG. 5, the active layer 21 including source and drain regions 21a and 21c and a channel region 21b are formed by injecting a N+ or P+ dopant using the gate electrode 23 as a doping mask.

Figure 6:
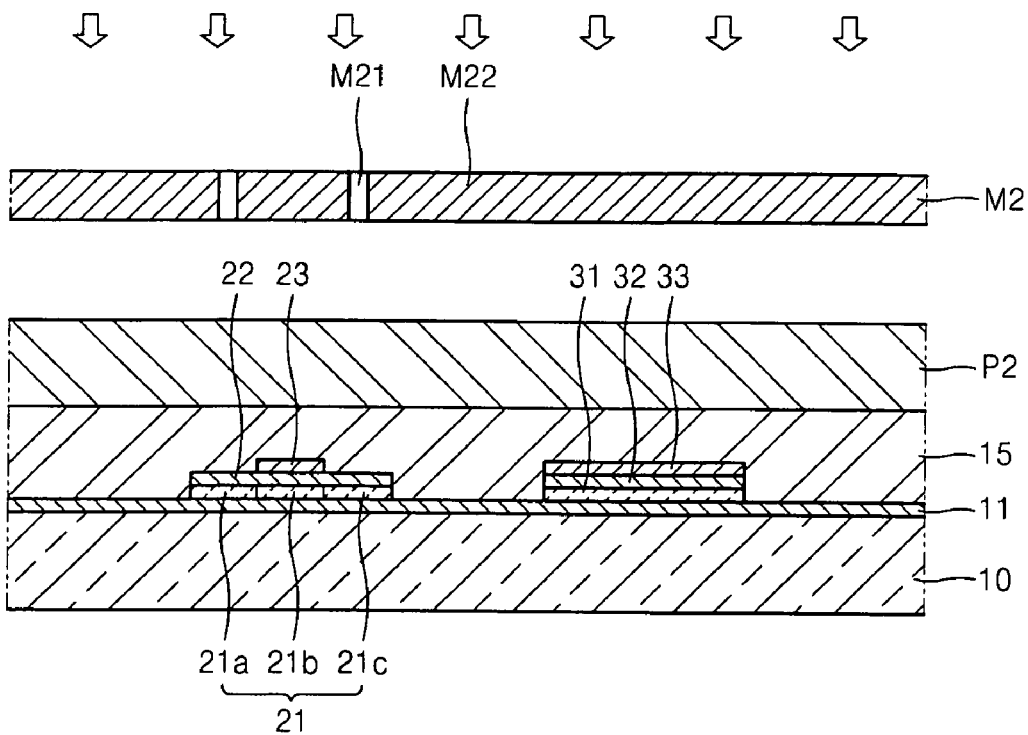

Referring now to FIG. 6, the second insulation layer 15 is deposited on the structure of FIG. 5 that is a result of the first mask process. A second photoresist layer P2 is formed on the upper surface of the second insulation layer 15 and a second mask M2 is then aligned over the second photoresist layer P2.

Like the first insulation layer 13, the second insulation layer 15 can be formed by depositing an inorganic insulation layer such as a $SiN_x$ or $SiO_x$ layer via a technique such as the PECVD technique, the APCVD technique, and the LPCVD technique. In addition, the second insulation layer 15 can include an inorganic insulation layer such as SiON, $Al_2O_3$, $TiO_2$, $Ta_2O_5$, $HFO_2$, $ZrO_2$, Barium Strontium Titanate (BST), and Lead Zirconate Titanate (PZT). Also, the second insulation layer 15 can be made out of a composite deposition body in which an organic insulation layer such as a phenol based polymer derivative, acryl based polymer, and amid based polymer is alternately deposited with the inorganic insulation layer. The second insulation layer 15 is made to be thicker than the first insulation layer 13. The surface of the second insulation layer 15 is made to be flat so that a boundary surface of a pixel electrode to be formed on the second insulation layer 15 can also be flat.

The second insulation layer 15 serves as a second insulation layer for TFT 20 and is interposed between the gate electrode 23 and source and drain electrodes 25 and 26 of the TFT 20 which will be described later. Also, the second insulation layer 15 is interposed between the second electrode 33 and the third electrode 35 of the capacitor 30 and functions as the second dielectric layer 15 of the capacitor 30.

A photoresist layer is coated on the upper surface of the second insulation layer 15 and then a solvent of the photoresist is removed by means of pre-baking or soft baking, thereby forming the second photoresist layer P2. The second mask M2, on which a predetermined pattern is drawn, is prepared and aligned to the substrate 10 to pattern the second photoresist layer P2.

The second mask M2 includes a light transmitting portion M21 and a light shielding portion M22. The light transmitting portion M21 transmits light of a predetermined wavelength and the light shielding portion M22 blocks the light. The light transmitting portion M21 includes a pattern corresponding to a predetermined space of the source and drain regions 21a and 21c of the active layer 21. The second photoresist layer P2 is exposed using the second mask M2 and then developed so that an etching process can be performed using the remaining photoresist pattern as an etch mask.

Figure 7:
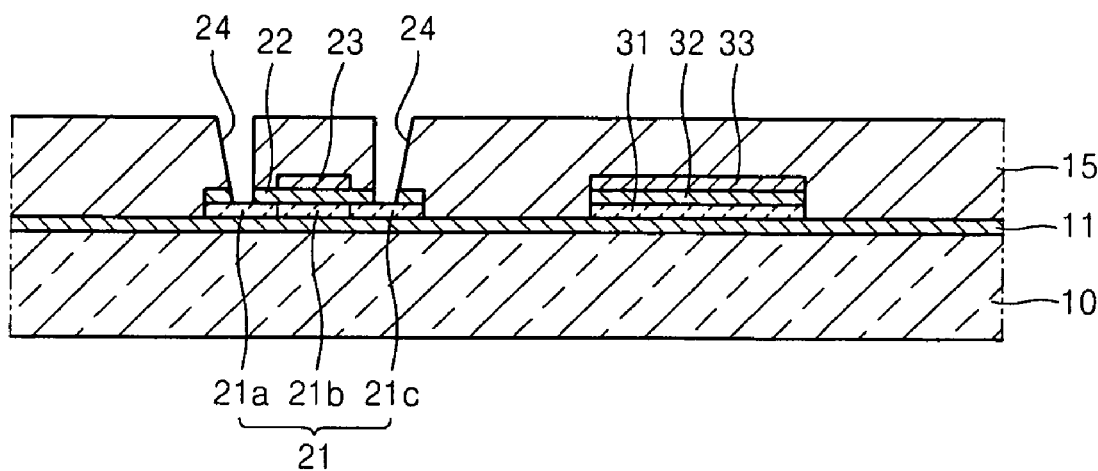

Referring now to FIG. 7, as a result of the above process using the second mask M2, contact holes 24 for exposing a part of each of the source and drain regions 21a and 21c are produced in the second insulation layer 15.

Figure 8:
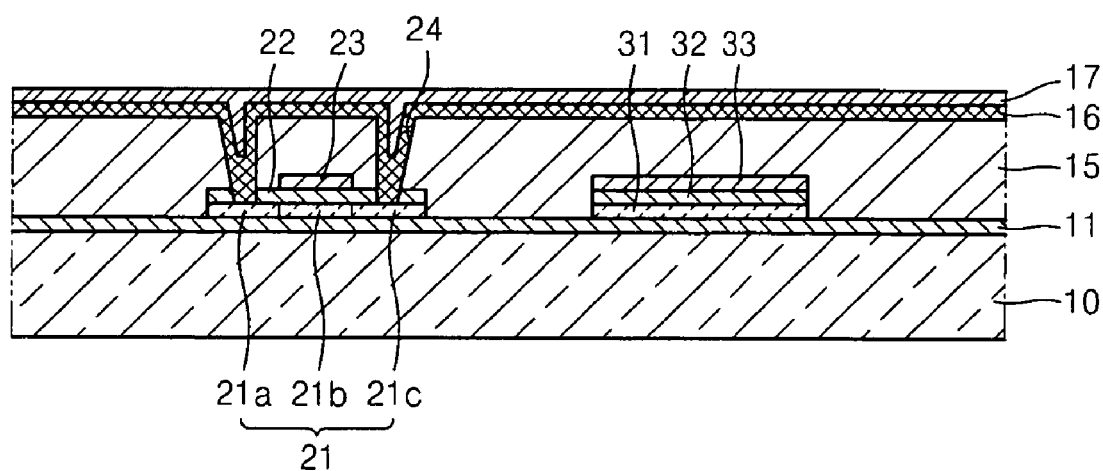

Referring now to FIG. 8, a second conductive layer 16 and a third conductive layer 17 are sequentially deposited on the structure of FIG. 7 that is a resultant of the second mask process. The second conductive layer 16 can include at least one material selected from transparent materials such as indium tin oxide (ITO), indium zinc oxide (IZO), ZnO or $In_2O_3$ that has a high work function. The second conductive layer 16 is a part of each of the third electrode 35 of the capacitor 30 and the pixel electrode 45 of the TFT array arrangement which will be described later.

The third conductive layer 17 is formed by depositing one or more conductive materials selected from a group consisting of Ag, Mg, Al, Pt, Pd, Au, Ni, Nd, Ir, Cr, Li, Ca, Mo, Ti, W, MoW, and Al/Cu via one of a variety of deposition techniques. The third conductive layer 17 is also a part of each of the third electrode 35 of the capacitor 30 and the source and drain electrodes 25 and 26 of the TFT 20 which will be described later.

Referring now to FIG. 9, photoresist is coated on the upper surface of the structure of FIG. 8 Then, a third photoresist layer P3 is formed by removing a solvent by pre-baking or soft baking the photoresist. A third mask M3 on which a predetermined pattern is drawn is prepared and aligned to the substrate 10 to pattern the third photoresist layer P3.

The third mask M3 is a half-tone mask including a light transmitting portion M31, a light shielding portion M32, and a semi-light transmitting portion M33. The light transmitting portion M31 transmits light of a predetermine wavelength, the light shielding portion M32 blocks the incident light, and the semi-light transmitting portion M33 transmits a portion of the incident light. The third mask M3 where the above pattern is drawn is aligned to the TFT array arrangement 10 and exposure is performed by radiating light of a predetermined wavelength on to the third photoresist layer P3.

Referring now to FIG. 10, a pattern of the photoresist remaining after a development process to remove an exposed portion of the third photoresist layer P3 is schematically illustrated. Although the positive-PR in which an exposed portion is removed is used in the present embodiment, the present invention is not limited thereto and a negative-PR can instead be used.

In FIG. 10, a photoresist portion P31 of the third photoresist layer P3 corresponding to the light transmitting portion M31 of the third mask M3 is removed upon development. Photoresist portions P32a, P32b, and P32c of the third photoresist layer P3 corresponding to the light shielding portion M32 and a photoresist portion P33 of the third photoresist layer P3 corresponding to the semi-light transmitting portion M33 remain present. The thickness of the photoresist portion P33 corresponding to the semi-light transmitting portion M33 is thinner than that of the photoresist portions P32a, P32b, and P32c corresponding to the light shielding portion M32. The thickness of the photoresist portion P33 corresponding to the semi-light transmitting portion M33 can be adjusted by changing the composition ratio or thickness of a material forming the pattern of the semi-light transmitting portions M33 of mask M3.

The second conductive layer 16 and the third conductive layer 17 above the substrate 10 are etched using an etching equipment by using the photoresist portions P32a, P32b, and P32c as etch masks. The structure of the photoresist portion P31 where no photoresist layer exists is first etched and the remaining parts of the photoresist portions P32a, P32b, P32c, and P33 are partially etched in a direction along the thickness of the photoresist layer.

Although it is not shown in FIG. 10, like the processing using the first mask M1, during the first etching process, the second conductive layer 16 and the third conductive layer 17 corresponding to the photoresist portion P31 where no photoresist layer exists are completely etched away. Since the photoresist portion P33 corresponding to the semi-light transmitting portion M33 is etched, the second conductive layer 16 and the third conductive layer 17 that is the structure beneath the photoresist portion P33 remains present. Also, since the photoresist portions P32a, P32b, P32c corresponding to the light shielding portion M32 remain present at a predetermined thickness after the first etching process, a second etching process is performed using the photoresist portions P32a, P32b, P32c as etch masks.

Turning now to FIG. 11, FIG. 11 schematically illustrates the structure of a TFT array arrangement after the second etching process is performed. Referring now to FIG. 11, the third conductive layer 17 in an area corresponding to the semi-light transmitting portion M33 is etched and removed so that metal of the second conductive layer 16 is patterned and thus the pixel electrode 45 is formed. Since the photoresist portions P32a, P32b, P32c corresponding to the light shielding portion M32 remain with a predetermined thickness after the first etching process, portions 25-1, 26-1, and 35-1 of the second conductive layer 16 and portions 25-2, 26-2, and 35-2 of the third conductive layer 17 remain and become the source and drain electrodes 25 and 26 of the TFT 20 and the third electrode 35 of the capacitor 30.

Although it is not shown in FIG. 11, a wire or contact hole connecting the source or drain electrode 25 or 26 of the TFT 20 and the second electrode 33 of the capacitor 30 can be formed without increasing the number of masks needed in the present invention and without being outside the substrate 10. Also, a wire or a contact hole connecting the first electrode 31 and the third electrode 35 of the capacitor 30 can be formed without increasing the number of masks needed in the present invention and without being outside the substrate 10. Although impurities such as N+ or P+ are not doped in the first electrode 31 of the capacitor 30, the semiconductor layer 12 can function as an electrode of a metal-oxide-semiconductor (MOS) capacitor by adjusting a voltage applied to the first electrode 31 within a range in which the capacity of the capacitor is saturated.

According to the TFT array arrangement according to the present invention, since the substrate having the above structure can be manufactured using a minimal number of masks, the costs can be reduced due to the decrease in the number of masks and the simplification of the manufacturing process. Also, by forming the capacitor to include three electrodes and two dielectric layers, the capacity of the capacitor can be increased without enlarging the area of the capacitor.

Figure 12:
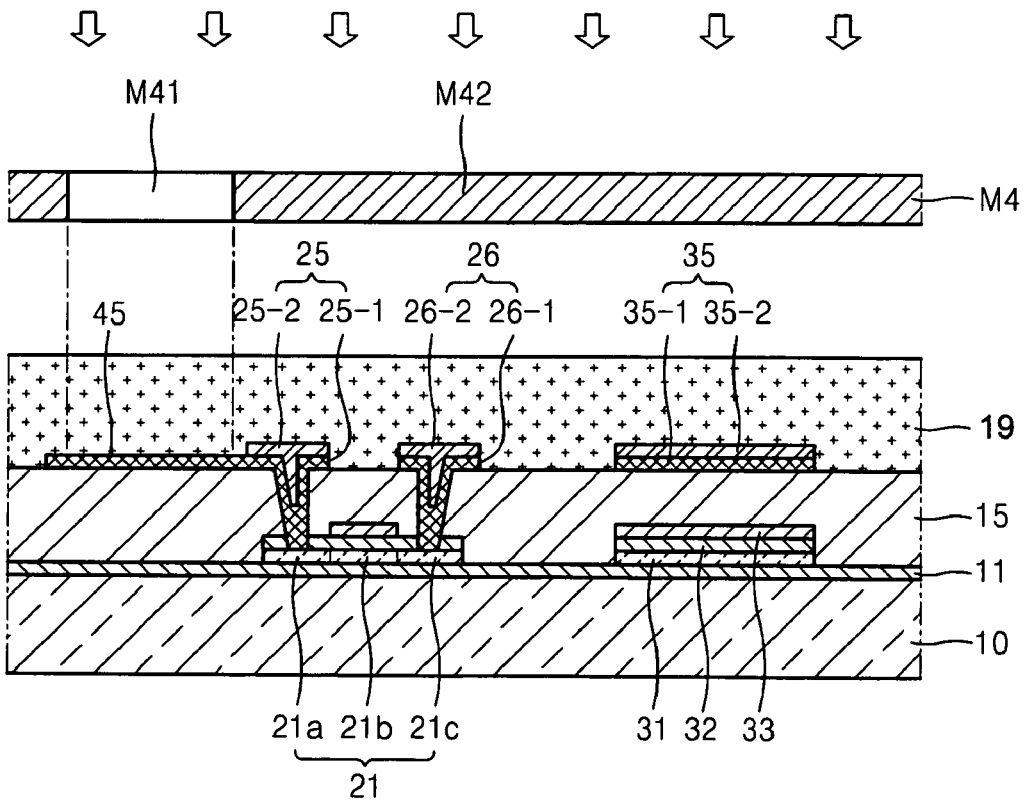
FIGS. 12-14 are cross-sectional views showing an organic light emitting display device having a TFT array arrangement and a method of manufacturing an organic light emitting display device according to an embodiment of the present invention.
Figure 13:
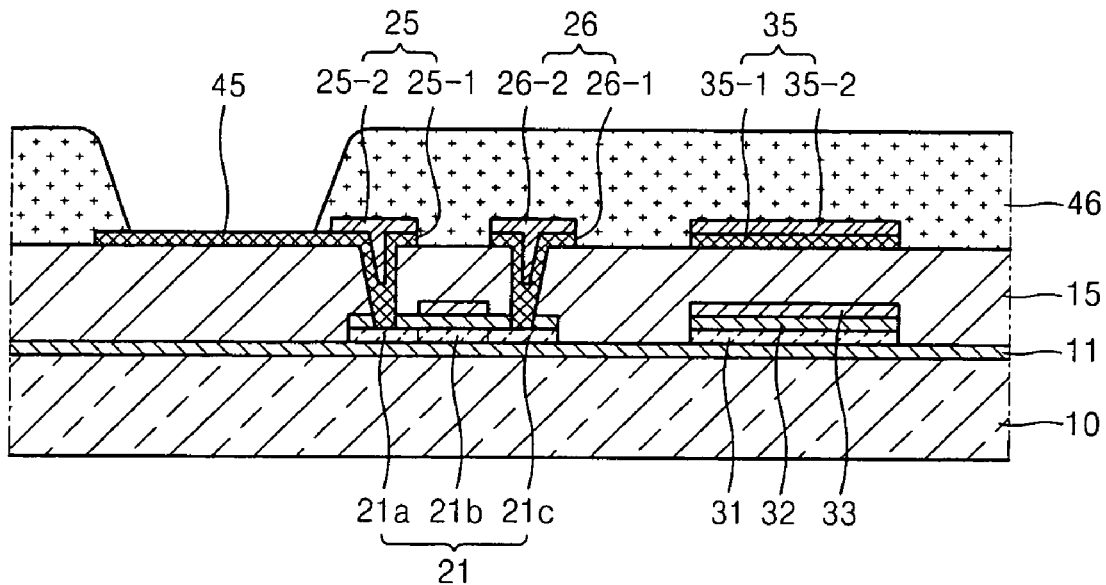
Figure 14:
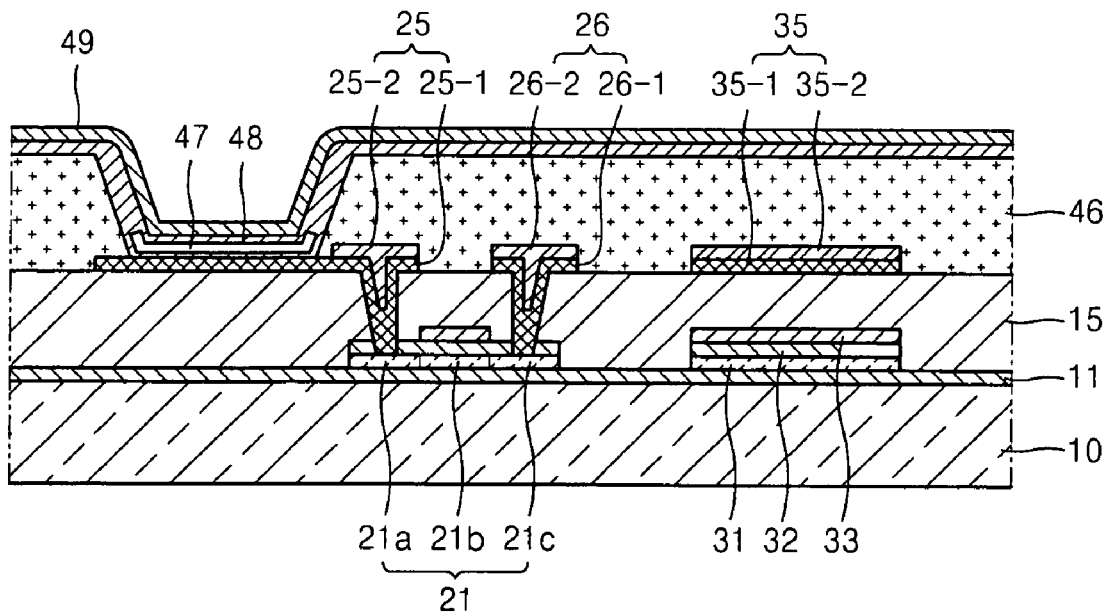

Turning now to FIGS. 12-14, FIGS. 12-13 are cross-sectional views sequentially showing a method of manufacturing an organic light emitting display device of FIG. 14 according to one embodiment of the present invention, the organic light emitting device having the TFT array arrangement of FIG. 11. FIG. 14 is a cross-sectional view schematically showing an organic light emitting display device according to an embodiment of the present invention. The organic light emitting display device according to the present embodiment is manufactured by performing subsequent processes shown in FIGS. 12 and 13 with respect to a resultant obtained by the processes of manufacturing a TFT array arrangement shown in FIGS. 1-11.

Referring now to FIG. 14, the organic light emitting display device according to the present embodiment includes the substrate 10, the buffer layer 11, the second insulation layer 15, the TFT 20, the capacitor 30, the pixel electrode 45, a pixel defining layer 46, an interlayer 48 including an organic light emitting layer 47, and a common electrode 49. Since the substrate 10, the buffer layer 11, the second insulation layer 15, the TFT 20, the capacitor 30, and the pixel electrode 45 are already described above in FIGS. 1-11, descriptions thereon will be omitted in the following description.

Referring now to FIG. 12, a third insulation layer 19 is formed on the upper surface of the above-described structure of FIG. 11 and a fourth mask M4 is aligned to the substrate 10. The third insulation layer 19 can be made out of one or more organic insulating material selected from a group consisting of polyimide, polyamide, acryl resin, benzocyclobutene, and phenol resin, using a spin coating technique. The third insulation layer 19 can be made out of not only the above organic insulating materials but also an inorganic insulating material such as that used in the first insulation layer 13 and in the second insulation layer 15. The third insulation layer 19 functions as a pixel defining layer (PDL) 46 of an organic light emitting display device which will be described later after describing the etching process using the fourth mask M4.

The fourth mask M4 includes a light transmitting portion M41 at a location corresponding to the pixel electrode 45 and a light shielding portion M42 in the remaining area. When light is radiated toward the fourth mask M4, the organic insulating material of the portion of the third insulation portion 19 where the light arrives can be directly removed by a dry etching technique. In the above-described first through third mask processes, a photoresist layer is deposited, exposed and developed and the lower structure is patterned using the developed photoresist layer as a mask. In the present embodiment, however, when the organic insulating material is used, the third insulation layer 19 can be directly dry etched without using a photoresist layer.

Referring now to FIG. 13, the third insulation layer 19 is etched to form an opening so that the pixel electrode 45 can be exposed, thereby forming the pixel defining layer 46 defining a pixel. Also, since the pixel defining layer 46 has a predetermined thickness, the interval between the edge of the pixel electrode 45 and the common electrode 49 is increased. Thus, an electric field is prevented from being concentrated at the edge of the pixel electrode 45 so that a short circuit between the pixel electrode 45 and the common electrode 49 can be prevented.

Referring now to FIG. 14, the interlayer 48 that includes the organic light emitting layer 47 and the common electrode 49 are formed on the pixel electrode 45 and the patterned pixel defining layer 46. The organic light emitting layer 47 emits light in response to the electrical drive of the pixel electrode 45 and the common electrode 49. A small molecular or polymer organic material can be used for the organic light emitting layer 47.

When the organic light emitting layer 47 is made out of a small molecular organic material, the interlayer 48 can include of a hole transport layer (HTL) and a hole injecting layer (HIL) in a direction toward the pixel electrode 45 with respect to the organic light emitting layer 47, and an electron transport layer (ETL) and an electron injection layer (EIL) in a direction toward the common electrode 49. Additionally, other various layers can be deposited as necessary. A variety of organic materials such as copper phthalocyanine (CuPc), N,N-Di(naphthalene-1-yl)-N,N-diphenyl-benzidine (NPB), and tris-8-hydroxyquinoline aluminum (Alq3) can be used.

When the organic light emitting layer 47 is made out of a polymer organic material, the interlayer 48 can consist of only the hole transport layer (HTL) in a direction toward the pixel electrode 45 with respect to the organic light emitting layer 47. The HTL can be made out of poly-(2,4)-ethylene-dihydroxy thiophene (PEDOT) or polyaniline (PANI) on the upper surface of the pixel electrode 45 via an inkjet printing or a spin coating technique. A poly-phenylenevynylene (PPV) based or polyfluorene based polymer organic material can be used as the organic material. A color pattern can be formed via a typical technique such as inkjet printing or spin coating, or by a thermal transfer technique using a laser.

The common electrode 49 that is the opposite electrode is deposited on the interlayer 48 that includes the organic light emitting layer 47. In the organic light emitting display device according to the present embodiment, the pixel electrode 45 can serve as the anode electrode and the common electrode 49 can serve as the cathode electrode, however the polarities of these electrodes can instead be reversed and still be within the scope of the present invention.

When the organic light emitting display device is a bottom emission type in which an image is embodied in a direction toward the substrate 10, the pixel electrode 45 is transparent and the common electrode 49 is reflective. A reflective electrode can be formed by thinly depositing a metal having a low work function, such as Ag, Mg, Al, Pt, Pd, Au, Ni, Nd, Ir, Cr, Li, Ca, LiF/Ca, or a compound thereof. Although it is not shown in FIG. 14, a sealing member (not shown) and a moisture absorbent material (not shown) for protecting the organic light emitting layer 47 from external moisture and oxygen can be further formed on the common electrode 49.

Since the above-described organic light emitting display device of the present embodiment can be manufactured using a minimal number of masks, manufacturing costs can be reduced due to the decrease in the number of masks and the simplified manufacturing process. Also, since the capacitor is embodied to have three electrodes and two dielectric layers, the capacity of the capacitor can be increased without increasing the size of the capacitor. Thus, for a bottom emission type organic light emitting display device in which the pixel electrode is transparent and an image is embodied in a direction toward the substrate 10, the reduction of aperture ratio can be prevented.

Turning now to FIGS. 15-19, FIGS. 15-19 are cross-sectional views showing another method of manufacturing a TFT array arrangement of FIG. 11 according to another embodiment of the present invention and a structure of a finished organic light emitting display device having the TFT array arrangement. Referring now to FIG. 15-19, a TFT array arrangement according to the present embodiment has a different structure in the conductive layers forming a pixel electrode 45', source drain electrodes 25' and 26', and a third electrode 35' of a capacitor, compared to that of FIGS. 11-14 of the previously described embodiment.

Figure 15:
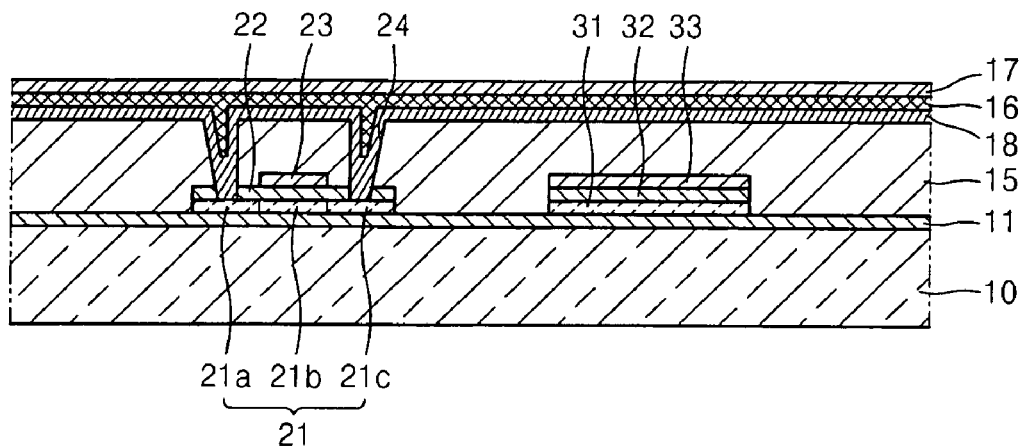
FIGS. 15-19 are cross-sectional views showing an organic light emitting display device having a TFT array arrangement and a method of manufacturing an organic light emitting display device according to another embodiment of the present invention.
Figure 19:
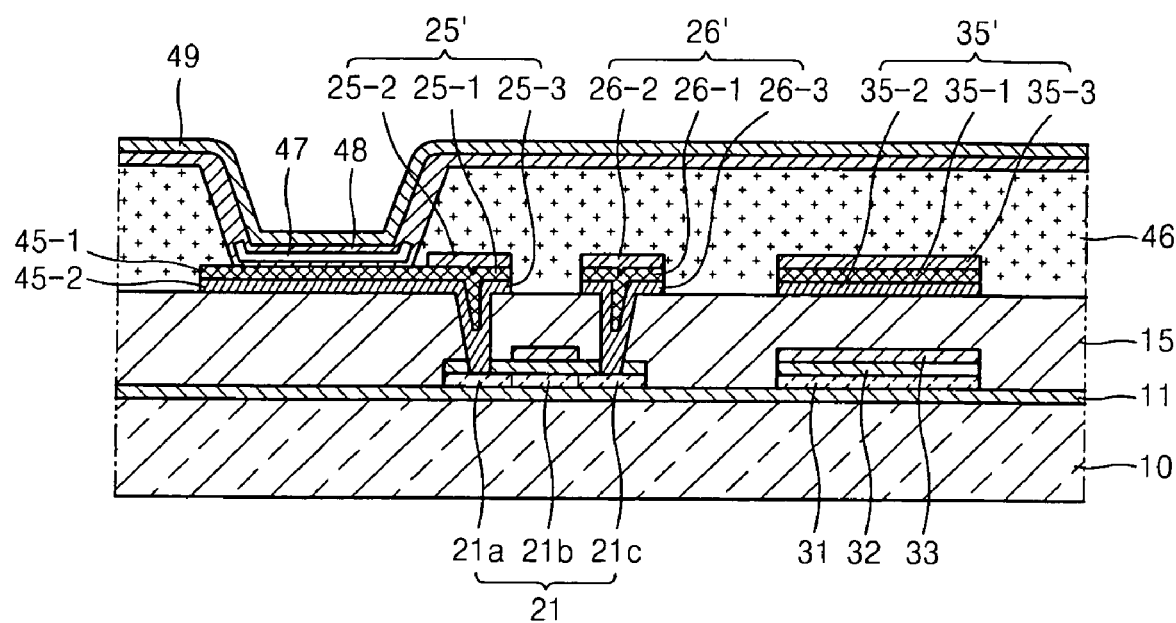

Referring now to FIGS. 15 and 19, compared to the structure of FIG. 8, a fourth conductive layer 18 is further deposited under the second conductive layer 16 and the third conductive layer 17. That is, the fourth conductive layer 18, the second conductive layer 16, and the third conductive layer 17 are sequentially deposited on the structure of FIG. 7 in the present embodiment. The fourth conductive layer 18 of the present embodiment can include one or more materials selected from a group consisting of Al, AlNd, ACX, AlNiLa, Ag, Mo, Ti, and MoW. The fourth conductive layer 18 becomes part 45-2 of the pixel electrode 45' (see FIG. 19), parts 25-3 and 26-3 of the source and drain electrodes 25' and 26' and part 35-2 of the third electrode 35' of the capacitor as illustrated in FIG. 19.

The second conductive layer 16 can include at least one transparent material selected from a group consisting of ITO, IZO, ZnO, and $In_2O_3$ that has a high work function as in the embodiment of FIGS. 11-14. The second conductive layer 16 later becomes part 45-1 of the pixel electrode, parts 25-1 and 26-1 of the source and drain electrodes 25' and 26' and part 35-1 of the third electrode of the capacitor as illustrated in FIG. 19. The third conductive layer 17 can include at least one conductive material selected from a group consisting of Ag, Mg, Al, Pt, Pd, Au, Ni, Nd, Ir, Cr, Li, Ca, Mo, Ti, W, MoW, and Al/Cu. The third conductive layer 17 later becomes part 25-2 and 26-2 of the source and drain electrodes 25' and 26' and layer 35-3 of the third electrode 35' of the capacitor as illustrated in FIG. 19.

Figure 16:
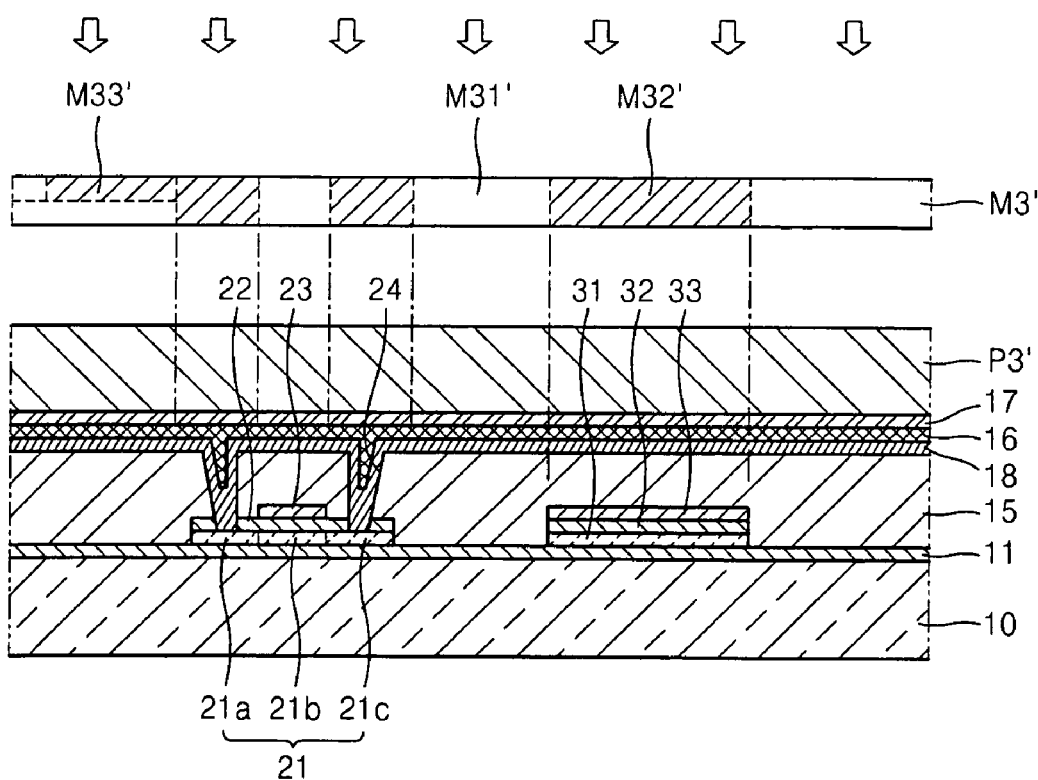

Referring now to FIG. 16, after photoresist is coated on the upper surface of the structure of FIG. 15, a solvent is removed by pre-baking or soft baking the photoresist so that a third photoresist layer P3' is formed. A third mask M3' on which a predetermined pattern is drawn is prepared and aligned to the substrate 10 to pattern the third photoresist layer P3'.

The third mask M3' is a half-tone mask including a light transmitting portion M31', a light shielding portion M32', and a semi-light transmitting portion M33'. The light transmitting portion M31' transmits light of a predetermined wavelength, the light shielding portion M32' blocks the incident light, and the semi-light transmitting portion M33' transmits a fraction of the incident light.

Figure 17:
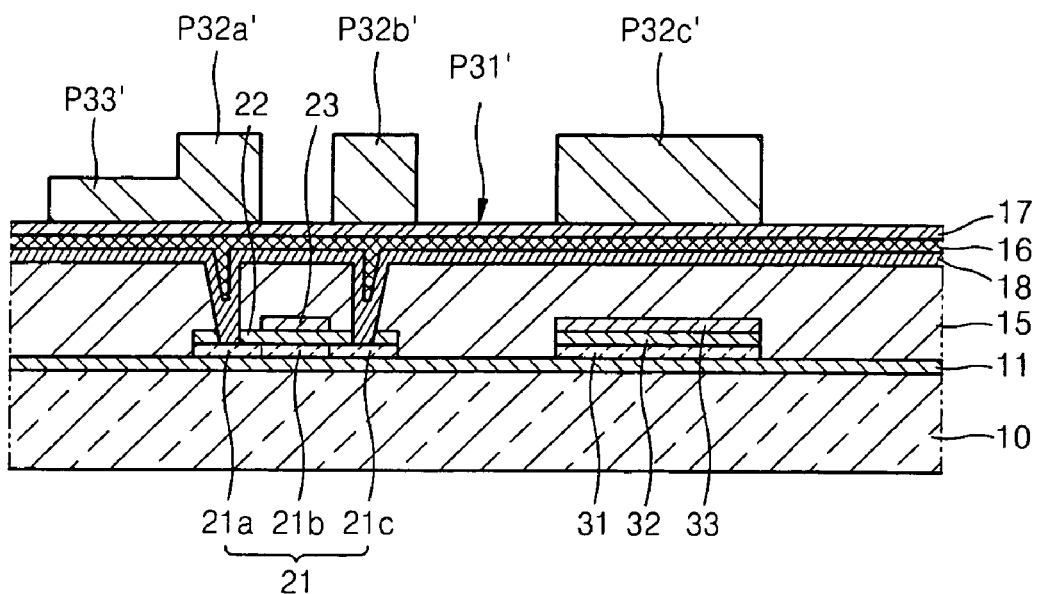

Referring now to FIG. 17, a pattern of the photoresist remaining after exposure and development is schematically illustrated. In FIG. 17, a photoresist portion P31' of the third photoresist layer P3' corresponding to the light transmitting portion M31' of the third mask M3' is removed. Photoresist portions P32a', P32b', and P32c' of the third photoresist layer P3' corresponding to the light shielding portion M32' and a photoresist portion P33' of the third photoresist layer P3 corresponding to the semi-light transmitting portion M33' remain present. The thickness of the photoresist portion P33' corresponding to the semi-light transmitting portion M33' is thinner than those of the photoresist portions P32a', P32b', and P32c' corresponding to the light shielding portion M32'. The thickness of the photoresist portion P33' corresponding to the semi-light transmitting portion M33' can be adjusted by changing the composition ratio or thickness of a material forming the pattern of the semi-light transmitting portions M33'.

The fourth conductive layer 18, the second conductive layer 16, and the third conductive layer 17 above the substrate 10 are etched via etching equipment by using the photoresist portions P32a', P32b', P32c', and P33' as etch masks. The structure of the photoresist portion P31' where no photoresist layer exists is first etched and the remaining parts of the photoresist portions P32a', P32b', P32c', and P33' are partially etched in a direction along the thickness of the photoresist layer.

During the first etching process, the fourth conductive layer 18, the second conductive layer 16, and the third conductive layer 17 of the photoresist portion P31' are entirely etched away. Since the photoresist portion P33' corresponding to the semi-light transmitting portion M33' is etched away during the first etching process, the fourth conductive layer 18, the second conductive layer 16, and the third conductive layer 17, which are beneath the photoresist layer P33 remain in tact. Also, since the photoresist portions P32a', P32b', and P32c' corresponding to the light shielding portion M32' remain at a predetermined thickness after the first etching process, a second etching process can be performed using the photoresist portions P32a', P32b', P32c' again as etch masks.

Figure 18:
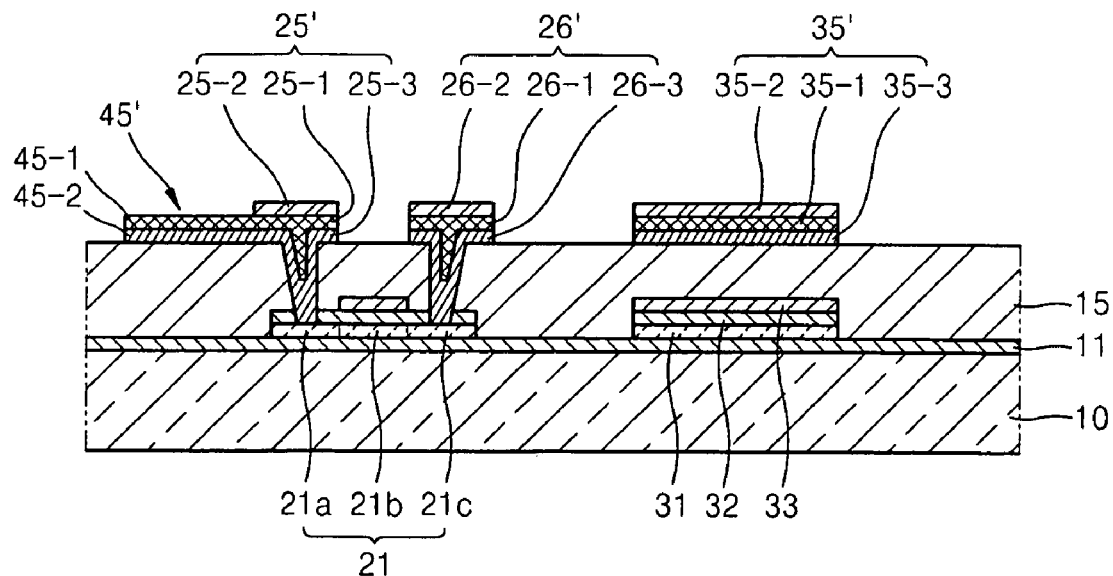

Referring now to FIG. 18, FIG. 18 schematically illustrates the structure of the TFT array arrangement after the second etching process is performed. Referring now to FIG. 18, the third conductive layer 17 in an area corresponding to the semi-light emitting portion M33' is etched away. Metal of the fourth conductive layer 18 and the second conductive layer 16 are patterned to form the pixel electrode 45'. Parts 25-3, 26-3, and 35-3 of the fourth conductive layer 18 and parts 25-2, 26-1, and 35-1 of the second conductive layer 16 remain present and become the source and drain electrodes 25' and 26' of the TFT 20 and the third electrode 35' of the capacitor 30.

Referring now to FIG. 19, FIG. 19 schematically illustrates the organic light emitting display device in which the pixel defining layer 46, the interlayer 48 that includes the organic light emitting layer 47, and the common electrode 49 are formed on the structure of FIG. 18, as in FIG. 14. The descriptions on portions of the constituent elements 46, 47, 48, and 49 that are the same as those of the organic light emitting display device of FIG. 14 is omitted.

The TFT array arrangement and the organic light emitting display device having the TFT array arrangement according to the present invention are advantageous for a top emission type organic light emitting display device in which an image is embodied in a direction opposite from the substrate 10 because the fourth conductive layer 18, that is reflective and is formed under the second conductive layer 16, can be used as a reflective electrode. Although in the present embodiment, the conductive materials 45-1 and 45-2 in two layers are used as the pixel electrode 45', the present invention is not limited thereto and conductive layers in multiple layers can be used as part of the pixel electrode in a way that does not increase the number of the mask processes.

According to the TFT array arrangement and the organic light emitting display device having the TFT array arrangement according to the present invention, since the substrate having the above-described structure can be manufactured using a minimal number of masks, manufacturing costs can be reduced due to the decrease in the number of masks and a simplified manufacturing process can result. Also, since the capacitor is embodied by three electrodes and two dielectric layers, the capacity of the capacitor can be increased without increasing the size of the capacitor.

Although in the present embodiment the organic light emitting display device is described as an example of a flat panel display device, the present invention is in no way limited thereto and any display device, including LCD devices using the TFT array arrangement according to the above-described embodiment, can be used therefor and still be within the scope of the present invention.

Also, although in the present invention, only one TFT and one capacitor is illustrated in the drawings, this is merely for the convenience of explanation and the present invention is in no way so limited. A plurality of TFTs and a plurality of capacitors can be included and still be within the scope of the present invention provided that the number of masks and mask processes are not increased.

As described above, according to the TFT array arrangement according to the present invention, the organic light emitting display device having the same, and a manufacturing method thereof, since the above-described substrate can be manufactured using fewer masks, costs can be reduced according to the decreased number of masks and the simplified manufacturing process. Also, since the capacitor has three electrodes and two dielectric layers, the capacity of the capacitor can be increased without increasing the size of the capacitor.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. A thin film transistor (TFT) array arrangement, comprising:
   a substrate;
   an active layer of a TFT and a first electrode of a capacitor arranged on the substrate in a pattern, the active layer and the first electrode being comprised of a same material and being separated from each other by a distance, the active layer including a source region, a drain region and a channel region;
   a first insulation layer separately arranged on the active layer and on the first electrode;
   a gate electrode and a second electrode arranged on the first insulation layer, the gate electrode and the second electrode being arranged on a same layer and being comprised of a same material, the gate electrode being arranged to correspond to the channel region of the active layer and the second electrode being arranged to correspond to the first electrode;
   a second insulation layer arranged on the substrate, the first insulation layer, the gate electrode, and the second electrode, the second insulation layer being perforated by contact holes exposing the source region and the drain region of the active layer;
   a source electrode and a drain electrode arranged within the contact holes and providing electrical connection to the source region and the drain region respectively of the active layer;
   a pixel electrode arranged on the second insulation layer and being connected to one of the source electrode and the drain electrode; and
   a third electrode being arranged on the second insulation layer at a location that corresponds to the second electrode, the third electrode being comprised of same materials as that of the combination of the source electrode, the drain electrode and the pixel electrode.

2. The TFT array arrangement of claim 1, further comprising a pixel defining layer arranged on the second insulation layer, an edge portion of the pixel electrode, the source and drain electrodes, and the third electrode.

3. The TFT array arrangement of claim 1, wherein the active layer of the TFT and the first electrode of the capacitor are comprised of multi-crystal silicon produced by crystallizing amorphous silicon.

4. The TFT array arrangement of claim 1, wherein shapes of end portions of the active layer and the first insulation layer of the TFT are the same.

5. The TFT array arrangement of claim 1, wherein shapes of end portions of each of the first electrode, the first insulation layer, and the second electrode of the capacitor are all the same.

6. The TFT array arrangement of claim 1, further comprising a buffer layer arranged on the substrate.

7. The TFT array arrangement of claim 1, wherein a thickness of the second insulation layer is greater than that of the first insulation layer.

8. The TFT array arrangement of claim 7, wherein a top surface of the second insulation layer is substantially flat.

9. The TFT array arrangement of claim 1, wherein the pixel electrode is comprised of a light transmitting material.

10. The TFT array arrangement of claim 9, wherein the pixel electrode is comprised of at least one material selected from a group consisting of indium tin oxide (ITO), indium zinc oxide (IZO), ZnO, and $In_2O_3$.

11. The TFT array arrangement of claim 1, wherein the pixel electrode is comprised of:
   a reflective material layer arranged on the second insulation layer; and
   a light transmitting material layer arranged on the reflective material layer.

12. The TFT array arrangement of claim 11, wherein the reflective material layer of the pixel electrode is comprised of at least one material selected from a group consisting of Al, AlNd, ACX, AlNiLa, Ag, Mo, Ti, and MoW.

13. The TFT array arrangement of claim 11, wherein the light transmitting material layer of the pixel electrode is comprised of at least one material selected from a group consisting of indium tin oxide (ITO), indium zinc oxide (IZO), ZnO, and $In_2O_3$.

14. The TFT array arrangement of claim 11, wherein the third electrode of the capacitor comprises:
   a first layer comprised of a same material as the reflective material layer of the pixel electrode;
   a second layer comprised of a same material as the light transmitting material layer of the pixel electrode; and
   a third layer comprised of a same material as a top layer of the source electrode and the drain electrode.

15. The TFT array arrangement of claim 14, wherein shapes of end portions of each of the first, second, and third layers of the third electrode of the capacitor are all the same.

16. An organic light emitting display device, comprising:
   an interlayer arrangement including an organic light emitting layer arranged on the pixel electrode of the TFT array arrangement of claim 1; and
   a common electrode arranged on the interlayer arrangement.

17. The organic light emitting display device of claim 16, further comprising a pixel defining layer arranged on the second insulation layer, an edge of the pixel electrode, the source and drain electrodes, and on the third electrode.

18. The organic light emitting display device of claim 16, further comprising a sealing structure to seal the organic light emitting layer, the sealing structure being arranged on the common electrode.

19. The organic light emitting display device of claim 16, the display device being a bottom emission display device where light produced within the organic light emitting layer is transmitted through the substrate to be viewed.

20. The organic light emitting display device of claim 16, wherein the pixel electrode is comprised of:
   a reflective material layer arranged on the second insulation layer; and
   a light transmitting material layer arranged on the reflective material layer.

21. The organic light emitting display device of claim 20, the display device being a top emission display device where light produced within the organic light emitting layer proceeds away from the substrate to be viewed.

22. A thin film transistor (TFT) array arrangement, comprising:
   a substrate;
   an active layer of a TFT and a first electrode of a capacitor arranged on the substrate in a pattern, the active layer and the first electrode being separated from each other by a distance, the active layer including a source region, a drain region and a channel region;
   a first insulation layer separately arranged on the active layer and on the first electrode, the first insulation layer correspond to the active layer functions as a gate insulation layer of the TFT, the first insulation layer correspond to the first electrode functions as a first dielectric layer;
   a gate electrode and a second electrode arranged on the first insulation layer, the gate electrode being arranged to correspond to the channel region of the active layer and the second electrode being arranged to correspond to the first electrode;
   a second insulation layer arranged on the substrate, the first insulation layer, the gate electrode, and the second electrode, the second insulation layer being perforated by contact holes exposing the source region and the drain region of active layer;
   a source electrode and a drain electrode arranged within the contact holes and providing electrical connection to the source region and the drain region respectively of the active layer;
   a pixel electrode arranged on the second insulation layer and being connected to one of the source electrode and the drain electrode; and
   a third electrode being arranged on the second insulation layer at a location that corresponds to the second electrode.

23. The TFT array arrangement of claim 22, wherein the active layer and the first electrode comprises:
   amorphous silicon.

24. The TFT array arrangement of claim 22, wherein the gate insulation layer of the TFT and the first dielectric layer of the capacitor are completely separated from each other upon said patterning.

25. The TFT array arrangement of claim 22, further comprising forming a buffer layer between the substrate and the active layer and the first electrode.

26. The TFT array arrangement of claim 22, the source region and the drain region of the active layer comprise impurities.

27. The TFT array arrangement of claim 22, wherein the third electrode comprises three conductive layers.

28. The TFT array arrangement of claim 27, wherein one of the three conductive layers of the third electrode is comprised of at least one material selected from a group consisting of Al, AlNd, ACX, AlNiLa, Ag, Mo, Ti, and MoW.

29. A organic light emitting display device, comprising:
   an interlayer arrangement that includes an organic light emitting layer on a TFT array arrangement of the claim 22; and
   a common electrode on the interlayer arrangement.

* * * * *